United States Patent [19]
Bolomey et al.

[11] Patent Number: 5,410,324
[45] Date of Patent: Apr. 25, 1995

[54] METHOD AND APPARATUS FOR DETERMINING ANTENNA RADIATION PATTERNS

[75] Inventors: Jean-Charles Bolomey, Paris, France; Cornelis G. Van't Klooster, Ge Voorhout, Netherlands

[73] Assignees: Centre National de la Recherche Scientifique; Agence Spatiale Europeene, both of Paris, France

[21] Appl. No.: 851,394

[22] Filed: Mar. 13, 1992

[30] Foreign Application Priority Data

Mar. 14, 1991 [FR] France .................. 91 03097

[51] Int. Cl.⁶ ........................................... G01R 29/10
[52] U.S. Cl. ............................. 343/703; 343/840
[58] Field of Search .......... 343/703, 840, 754, 772, 343/773, 775

[56] References Cited

U.S. PATENT DOCUMENTS

| | | | |
|---|---|---|---|
| 4,270,129 | 5/1981 | Herper et al. | 343/703 |
| 4,888,596 | 12/1989 | Conanan | 343/703 |
| 5,128,621 | 7/1992 | Berthaud et al. | 343/754 |

FOREIGN PATENT DOCUMENTS

| | | | |
|---|---|---|---|
| 0069628 | 1/1983 | European Pat. Off. | |
| 2509064 | 1/1983 | France | |
| 2614419 | 10/1988 | France | |
| 2632417 | 12/1989 | France | |
| 9007406 | 12/1991 | France | |
| 0165767 | 10/1982 | Japan | 343/703 |
| 3927228 | 2/1991 | Netherlands | 343/703 |
| 1332244 | 8/1987 | U.S.S.R. | 343/703 |
| WO8808529 | 11/1988 | WIPO | |

OTHER PUBLICATIONS

The Bell system technical Journal, Sep. 1965, pp. 1284–1293.
"Radiation Pattern of a Reflector Antenna from Near Field Measurements over the Focal Region of a Coupled Lens or Offset Reflector", S. X. Yin et al., AP-S International Symposium 1988 Digest, vol. 3, 1988, Syracuse, New York US, pp. 1114–1117.
"Rapid Near-Field Antenna Testing Via Arrays of Modulated Scattering Probes", J. C. Bolomey et al., IEEE Transactions on Antennas and Propagation, vol. 36, No. 6, Jun. 1988, New York, US, pp. 804–814.
"Near-Field Testing of Radar Antennas", Edward B. Joy, Microwave Journal, vol. 33, No. 1, Jan. 1990, Dedham US, pp. 119–130.

Primary Examiner—Donald Hajec
Assistant Examiner—Tan Ho
Attorney, Agent, or Firm—Lowe, Price, LeBlanc & Becker

[57] ABSTRACT

A compact range for the determination of the radiation pattern of a first antenna (1), comprises a focusing system (3) and apparatus (2) supporting the first antenna in the quiet zone of the focusing system. For that purpose, the base comprises a modulated-retransmission probe array (6, 16) mounted in the focal plane (7) of the focusing system, a second antenna (10, 17) mounted near the probe array, apparatus (13) to determine, from the electromagnetic radiation retransmitted by the probe array and collected by one of the antennas during the transmission of electromagnetic radiation by the other, a signal SI representing the field at each point of the probe array, and a display (14) for displaying the signal.

20 Claims, 2 Drawing Sheets

METHOD AND APPARATUS FOR DETERMINING ANTENNA RADIATION PATTERNS

TECHNICAL FIELD

The present invention concerns a method and apparatus for determining the radiation pattern of an antenna.

BACKGROUND ART

A number of different methods are known for determining antenna radiation patterns, that is the repartition, at a great distance, of the power radiated by an antenna. A first method consists of measuring the antenna response to a plane wave, that is, to be situated far from it. In that case the measurement a large distance away can be carried out by rotating the antenna in the receiving mode when it is in the field of a constant and distant source and recording the signal picked up by the antenna as a function of its direction. However, this method incurs a serious drawback that it cannot be applied to any equipment of a manageable size.

Again, measurements may be carried out in the far field using a compact range, that is, placing a source at the focus of a focusing system and the antenna in the "quiet" zone of this system. In this manner, it is possible to simulate, within a short distance, the conditions for the far field. The radiation pattern is determined by changing the orientation of the antenna relative to the direction of the plane wave in the quiet zone. Consequently, the antenna must be put on a support allowing two-dimensional orientation, entailing fairly complex mechanical means. Moreover, the determination of the entire radiation pattern requires measuring the antenna response in each position and for each of its pattern configurations (electronic sweep antenna, adaptive antenna, radome-equipped antenna . . .) and hence may be exceedingly time-consuming and tedious.

Moreover, it has already been suggested to vary the source position in the focal zone of the focusing system in order to vary the direction of the plane wave relative to the antenna. However such a setup also requires mechanical equipment so that, in this case, the source position can be varied. Moreover, the setup allows a swing of only a few degrees about the antenna axis, when as a rule much more is needed especially at low frequencies where the radiation pattern is of little significance in so tight an angular range. Again, one measurement must be taken for each source position.

In order to alleviate the above drawbacks relating to far field measurements, it has also be proposed to take measurements in the near field using the antenna transmission and measuring the field radiated in the different directions near the antenna.

In that case, by converting by computation from the near to the far field, the antenna response to a plane wave can be found and, in equivalent manner, its transmission radiation pattern.

However, this method entails moving the receiver step by step all around the antenna and measuring the detected field at every step. Furthermore, the far-field antenna behavior can only be ascertained after taking all the near-field measurements, so that the pattern cannot be recorded in real time.

An object of the present invention is to alleviate the above drawbacks by creating a method and apparatus for the determination of an antenna radiation pattern whereby this pattern can be ascertained nearly instantaneously in the absence of calculations and with a minimum of mechanical motion.

In accordance with a first aspect of the invention, a method for determining the radiation pattern of a first antenna, such that the antenna is placed in the quiet zone of a focusing system, comprises the steps of:
setting up an array of modulated scattering probes in the focal plane of the focusing system,
setting up a second antenna near the probe array,
transmitting electromagnetic radiation from one of the antennas,
picking up, on the other antenna, the electromagnetic radiation retransmitted by the probe array,
determining from the picked-up radiation a signal which represents the field at each point of the probe array, and
displaying said signal.

Modulated scattering probe arrays are already known, in particular they are used in measuring at a number of points the field radiated by a microwave source. As a rule, such devices comprise an antenna loaded by a diode at each point, low-frequency signal generators, multiplexing means arranged between the generators and each diode and drivers for the multiplexing means so that one of the diodes is biased by the low-frequency signal and further so that, in response to the low-frequency signal and to a picked-up microwave signal, a signal representing the microwave field at the point where the biased-diode loaded antenna is located shall be generated.

Illustratively, Bolomey U.S. Pat. No. 5,128,621 describes a linear probe array and French patent document A 2,509,064 as well as WO91/19990 describes planar probe arrays.

It shall be borne in mind it has already been proposed, for instance in French patent document 2,632,417, to make use of an array of modulated-scattering probes to plot the near-field of a transmission antenna in order to compute from it its far-field radiation pattern. However, the procedure described in this latter document is akin to the so-called above near field techniques, the mechanical displacement of the receiver merely being replaced by an electronic sweep of the probe array. The need to carry out all the near-field measurements remains before the computational determination of the far-field radiation pattern.

The method of the invention, on the contrary, makes use of an array of modulated scattering probes located in the focal plane of the focusing system, the antenna to be tested being located in the quiet zone of this system and thereby allowing immediate determination of the far-field radiation pattern.

Hence, the method of the invention allows acquiring, in real time, data relating to the properties of the antenna in the far-field.

This method requires no change at all in the antenna position, and this is especially significant when the antennas must operate in zero-gravity and accordingly, when on the ground, must be supported by complex equipment.

Moreover, the rapid implementation of the method of the invention allows testing the antenna in different modes of thermal or mechanical deformations.

A planar array may be used in order to directly obtain the pattern in space or a linear array may be used by means of which the focal plane is swept. In the latter case, preferably the sweep is achieved by pivoting the linear array around the focus of the focusing system, whereby the pattern can be instantaneously obtained in a particular sectional plane, for instance in the E or the H plane.

In a preferred embodiment mode of the invention, the tested antenna is transmitting. However, it may be usefully operated in the receiving mode, for instance when a non-reciprocal antenna is tested which involves one pattern for transmission and another for receiving, in which event the antenna shall be consecutively transmitting and receiving.

Another aspect of the present invention is a compact range to determine the radiation from a first antenna and comprising a focusing system and support means for the first antenna in the quiet zone of the focusing system, the range being characterized in that it comprises:

- a modulated scattering probe array mounted in the focal plane of the focusing system,
- a second antenna mounted near the probe array,
- means for deducting a signal, representing the field at each point of the probe array, from the electromagnetic radiation transmitted by the probe array and detected by one of the antennas during electromagnetic transmission from the other antenna, and
- means for displaying the signal.

In particular, the second antenna may be a horn or, in the event of using a linear array of probes, a guide structure arrayed along said linear array.

A non-limiting, illustrative embodiment mode of the invention is described below in relation to the drawings.

BEST MODE FOR PRACTICING THE INVENTION

Figure 1:
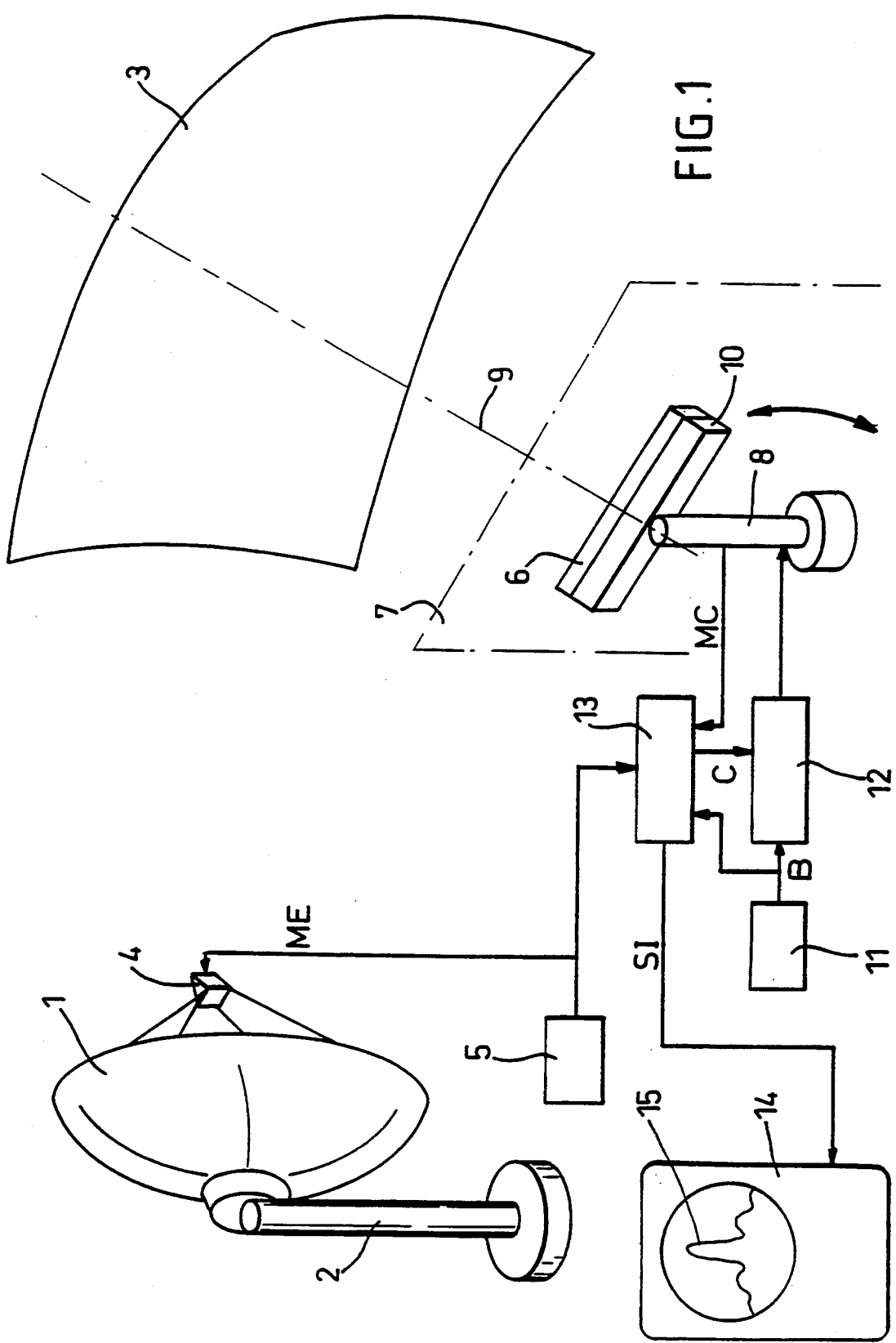
FIG. 1 is a schematic partly in perspective and partly as a block circuit of a first embodiment mode of the invention.

FIG. 1 schematically shows a compact range for the determination of the radiation pattern of an antenna 1 which shall be tested. Antenna 1 is rigidly affixed to a mast 2 in the quiet zone of a focusing reflector 3.

In this case, the tested antenna 1 is a reflector antenna fed from a primary source 4 and receiving a microwave signal ME from a microwave generator 5. The microwave signal from the generator is a single-frequency signal of which the frequency can be varied within the antenna passband.

A linear array 6 of modulated scattering probes is mounted in the focal plane 7 of the reflector 3 on a mast 8 in such a way it can pivot in the plane 7 about the axis 9 of the reflector 3.

In this embodiment, the linear array 6 cooperates with a waveguide 10 to form a collector antenna for the radiation from antenna 1, focused by the reflector 3 and transmitted by the probe array 6. The assembly consisting of the array 6 and the waveguide 10 shall not be described further because it is known, for instance from French patent document A 2,614,419. As described in that document, the individual probes of the linear array 6 are biased consecutively at the rate of a low-frequency signal B from a generator 11, using a multiplexer 12.

An electronic circuit 13, managed by a microprocessor, comprises two microwave inputs receiving the ME signal from the generator 5 and an MC signal from the waveguide 10, a low-frequency input receiving the signal B, a digital output for a signal C driving the multiplexer 12 and an output for a SI signal representing the measured microwave field and fed to a display 14 such as an oscilloscope.

In the electronic circuit 13, the collected microwave signal MC undergoes synchronous microwave detection by means of the microwave signal ME and then a second low-frequency synchronous detection by means of the signal B. Among all collected radiations, only the radiation transmitted by the probe loaded by the signal B is modulated by this signal. Thereby the signal MC from the waveguide 10 at every instant only represents the field at the location of the probe loaded by the signal B. Because the microprocessor of the circuit 5 controls the consecutive biasing of each probe, the screen of the oscilloscope 14, controlled by signal SI, directly shows at 15 the field intensity as a function of the abscissa along the linear array of probes 6.

The curve 15 therefore constitutes the cross-section of the radiation pattern of antenna 1 assumed being at infinity in the direction of the axis 9 and in the plane containing the linear probe array 6, following suitable projection onto the polarization axes of the antenna.

By pivoting the array 6 about the axis 9, it is thus possible, instantaneously and without computation, to obtain the cross-sectional radiation pattern in any plane. Obviously, the plane 7 also may be swept in a manner other than by rotation about the axis 9, for instance by displacing the probe array 6 perpendicularly to its longitudinal direction.

Figure 2:
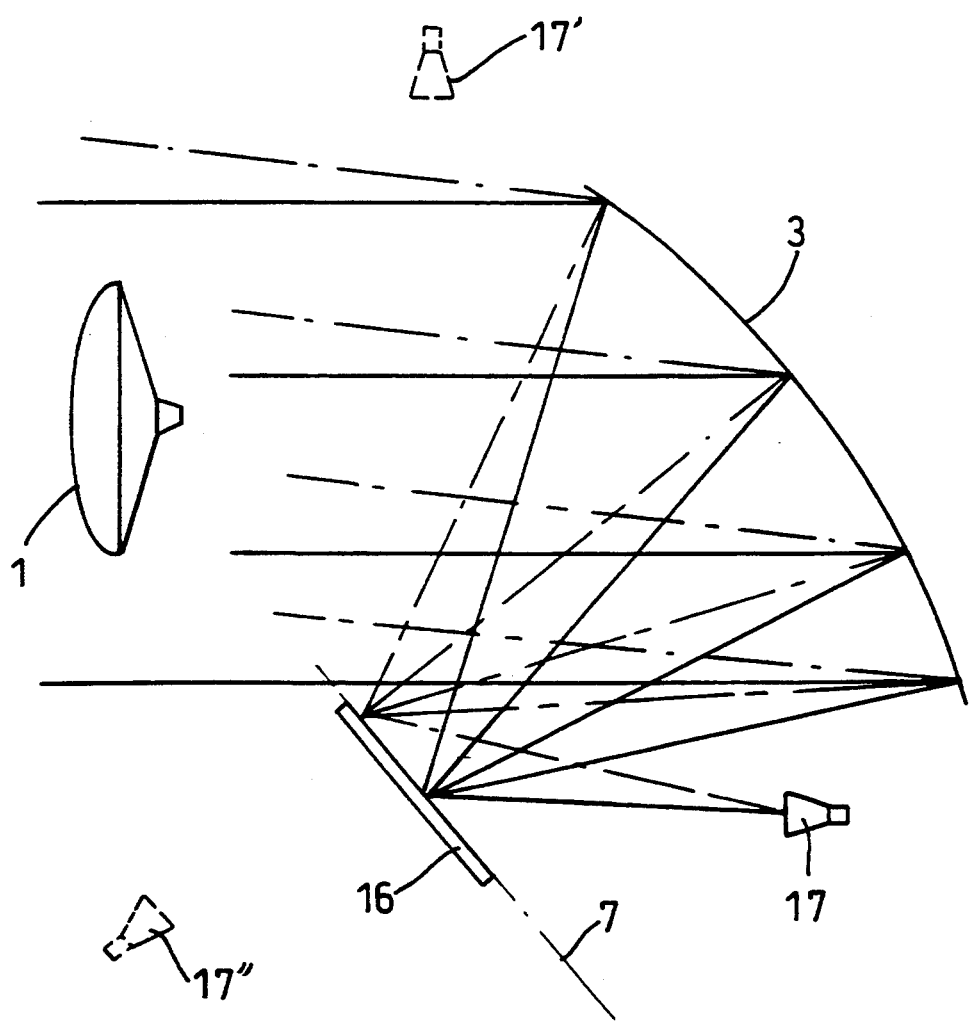
FIG. 2 is a top view of a second embodiment mode of the invention.

FIG. 2 shows another embodiment whereby the modulated scattering probe-array is a planar array 16 located in the focal plane 7 of the reflector 3. Illustratively the array 16 is such as described in French patent document A 2,509,064 or in French patent application 90 07406. The collector antenna is a horn which may be positioned as shown by solid lines at 17 or by dashed lines at 17', in which case the array 16 operates in the reflecting mode, or also as shown by dashed lines at 17", in which case the array 16 is in the transmitting mode.

As in the first embodiment, the collector 17 at every instant only receives the radiation from one biased probe of the array 16. By sweeping the array 16, the field magnitude may be recorded for all its points, the set of these magnitudes directly representing the radiation pattern of antenna 1.

Being similar to the electronics of the embodiment of FIG. 1, details of FIG. 2 are omitted. In both cases calibration takes place in the same manner. Letting f be the focal length of reflector 3 and r the distance from a probe in the array to the reflector axis, the particular angle "a" of the radiation pattern is determined by $$a = r/f.$$

Obviously the measured field values from the various probes in the array may be weighted in order to compensate any aberrations due to different distances between the probes and the reflector axis. In any event, such aberrations are independent of the tested antenna so that the weighting factors need be ascertained only once at a given frequency.

I claim:

1. A method for determining the radiation pattern of a first antenna, where the antenna is placed fixedly in the quiet zone of a focusing system having a focal plane, comprising the steps of:

placing a modulated scattering probe array in the focal plane of the focusing system, placing a second antenna near the probe array, causing one of the two antennas to transmit electromagnetic radiation so as to cause the modulated scattering probe array to retransmit electromagnetic radiation, causing the other antenna to collect the electromagnetic radiation retransmitted by the probe array, determining, from the retransmitted electromagnetic radiation collected by the other antenna, a signal which represents the field at each point of the probe array, and displaying this signal as the radiation pattern of the first antenna.

2. A method as defined in claim 1, wherein a planar probe array with modulated scattering is used.

3. A method as defined in claim 2, wherein the first antenna is transmitting.

4. A method as defined in claim 1, wherein a modulated scattering linear probe-array is used and the focal plane is swept by said array.

5. A method as defined in claim 4, wherein the linear array is made to pivot about the axis of the focusing system.

6. A method as defined in claim 5, wherein the first antenna is transmitting.

7. A method as defined in claim 4, wherein the first antenna is transmitting.

8. A method as defined in claim 1, wherein the first antenna is transmitting.

9. A compact range for the determination of the radiation pattern of a first antenna, comprising a focusing system having a focal plane and means fixedly supporting said first antenna in the quiet zone of the focusing system, said compact range comprising:

a modulated scattering probe array mounted in the focal plane of said focusing system for retransmitting received radiation, a second antenna mounted near said probe array, means for generating, from electromagnetic radiation retransmitted by the probe array and collected by one of the antennas during transmission of electromagnetic radiation by the other antenna, a signal representing the radiation pattern of said first antenna, and means for displaying said signal.

10. A compact range as defined in claim 9, wherein said probe array is a planar array.

11. A compact range as defined in claim 10, wherein said second antenna is a horn.

12. A compact range as defined in claim 9, wherein said array is a linear array and comprises means to displace said array in the focal plane of the focusing system.

13. A compact range as defined in claim 12, wherein said second antenna is a guide structure mounted along said linear array.

14. A compact range as defined in claim 12, wherein said displacement means comprises devices to pivot the linear array about the axis of the focusing system.

15. A compact range as defined in claim 14, wherein said second antenna is a guide structure mounted along said linear array.

16. A compact range as defined in claim 14, wherein said second antenna is a horn.

17. A compact range as defined in claim 12, wherein said second antenna is a horn.

18. A compact range as defined in claim 9, wherein said second antenna is a horn.

19. A method for determining the radiation pattern of an antenna, where the antenna is placed fixedly in the quiet zone of a focusing reflector having a focal plane, comprising the steps of:

placing a modulated probe array in the focal plane of the focusing reflector, causing the antenna to transmit electromagnetic radiation, receiving the transmitted electromagnetic radiation in the modulated probe array, determining, from the received electromagnetic radiation collected by the modulated probe array, a signal which represents the electromagnetic radiation field at each point of the probe array, and displaying this signal as the radiation pattern of the antenna.

20. A compact range for the determination of the radiation pattern of an antenna, comprising:

a focusing reflector having a focal plane;

means for fixedly supporting said antenna in the quiet zone of said focusing reflector;

a modulated probe array mounted in the focal plane of said focusing reflector for receiving radiation transmitted by said antenna and reflected by said focusing reflector;

means for generating, from electromagnetic radiation received by the probe array, a signal representing the radiation pattern of said antenna, and means for displaying said signal.

* * * * *